United States Patent
Simonson et al.

(10) Patent No.: US 10,224,536 B2
(45) Date of Patent: Mar. 5, 2019

(54) ENERGY STORAGE APPARATUS IN DEVICE WITH CONDUCTIVE CASE STRUCTURE

(71) Applicant: Seagate Technology LLC, Cupertino, CA (US)

(72) Inventors: Dana Lynn Simonson, Owatonna, MN (US); John Wayne Shaw, II, Frederick, CO (US)

(73) Assignee: Seagate Technology LLC, Cupertino, CA (US)

( * ) Notice: Subject to any disclaimer, the term of this patent is extended or adjusted under 35 U.S.C. 154(b) by 78 days.

(21) Appl. No.: 14/691,740

(22) Filed: Apr. 21, 2015

(65) Prior Publication Data

US 2016/0313771 A1 Oct. 27, 2016

(51) Int. Cl.
| | |
|---|---|
| *H01G 9/00* | (2006.01) |
| *H01M 4/04* | (2006.01) |
| *H01M 10/42* | (2006.01) |
| *H01M 4/66* | (2006.01) |
| *H01G 9/08* | (2006.01) |
| *H05K 1/16* | (2006.01) |
| *H01G 11/78* | (2013.01) |
| *H01G 11/82* | (2013.01) |
| *H01G 2/10* | (2006.01) |
| *H01G 4/224* | (2006.01) |
| *H01G 9/15* | (2006.01) |

(52) U.S. Cl.
CPC ............... *H01M 4/04* (2013.01); *H01G 2/10* (2013.01); *H01G 2/106* (2013.01); *H01G 4/224* (2013.01); *H01G 9/08* (2013.01); *H01G 11/78* (2013.01); *H01G 11/82* (2013.01); *H01M 4/663* (2013.01); *H01M 10/425* (2013.01); *H05K 1/162* (2013.01); *H01G 9/0029* (2013.01); *H01G 9/15* (2013.01); *H05K 2201/026* (2013.01); *H05K 2201/0999* (2013.01); *H05K 2201/10371* (2013.01); *H05K 2201/10969* (2013.01); *Y02E 60/13* (2013.01)

(58) Field of Classification Search
CPC .................................. H01G 4/30; H01G 9/00
USPC ...................................... 361/301.4, 303, 502
See application file for complete search history.

(56) References Cited

U.S. PATENT DOCUMENTS 2,473,240 A 6/1949 Byrne
4,862,328 A * 8/1989 Morimoto .............. H01G 9/155
252/62.2

(Continued)

FOREIGN PATENT DOCUMENTS

JP 2012113458 A * 6/2012

*Primary Examiner* — Eric W Thomas
(74) *Attorney, Agent, or Firm* — Taylor English Duma LLP

(57) ABSTRACT

Technologies are described herein for implementing a space-efficient internal energy storage apparatus in a data storage device or other electronic device have a metallic or otherwise electrically-conductive housing or case structure. The energy storage apparatus comprises an interior surface of the metallic housing, a conductive layer disposed parallel to the interior surface of the metallic housing, and a separator disposed between the interior surface and the conductive layer. The metallic housing is configured to act as a first electrode of the energy storage apparatus and the conductive layer is configured to act as an opposing electrode to the first electrode.

17 Claims, 4 Drawing Sheets

(56) References Cited

U.S. PATENT DOCUMENTS

| | | | | |
|---|---|---|---|---|
| 5,144,537 A | * | 9/1992 | Tsuchiya | H01G 9/155 29/25.03 |
| 6,455,108 B1 | * | 9/2002 | Muffoletto | H01G 9/042 427/446 |
| 7,099,143 B1 | * | 8/2006 | Fife | H01G 9/035 361/503 |
| 7,813,107 B1 | * | 10/2010 | Druding | H01G 9/008 361/508 |
| 7,864,505 B1 | * | 1/2011 | O'Brien | H01G 4/30 361/303 |
| 7,974,038 B2 | * | 7/2011 | Krishnan | G11B 5/59638 360/75 |
| 8,411,413 B2 | | 4/2013 | Eilertsen | |
| 8,576,542 B2 | * | 11/2013 | Snyder | H01G 11/02 361/523 |
| 2003/0169558 A1 | * | 9/2003 | Olson | H01G 9/155 361/502 |
| 2005/0243501 A1 | * | 11/2005 | Muffoletto | H01G 9/06 361/534 |
| 2006/0279906 A1 | * | 12/2006 | Stemen | H01G 9/042 361/517 |
| 2008/0218183 A1 | * | 9/2008 | Sato | H03K 17/962 324/686 |
| 2009/0141423 A1 | | 6/2009 | Lai | |
| 2011/0035813 A1 | * | 2/2011 | Trantham | G06F 21/78 726/34 |
| 2011/0134571 A1 | | 6/2011 | Chan et al. | |
| 2014/0111906 A1 | * | 4/2014 | Eilertsen | H01G 9/042 361/502 |
| 2014/0160704 A1 | * | 6/2014 | Janssen | H01G 2/06 361/759 |

\* cited by examiner

ENERGY STORAGE APPARATUS IN DEVICE WITH CONDUCTIVE CASE STRUCTURE

BRIEF SUMMARY

The present disclosure relates to technologies for implementing a space-efficient internal energy storage apparatus in a data storage device or other electronic device having a metallic or otherwise electrically-conductive housing or case structure. According to some embodiments, an energy storage apparatus for integration into an electronic device comprises an interior surface of a metallic housing of the electronic device, a conductive layer disposed parallel to the interior surface of the metallic housing and a separator disposed between the interior surface and the conductive layer. The metallic housing is configured to act as a first electrode of the energy storage apparatus and the conductive layer is configured to act as an opposing electrode to the first electrode.

According to further embodiments, a storage device comprises a metallic housing, a printed circuit board containing controller circuitry, and an internal energy storage apparatus. The internal energy storage apparatus comprises an interior surface of the metallic housing, a conductive layer disposed parallel to the interior surface and a separator disposed between the interior surface and the conductive layer. The metallic housing is configured as the first electrode of the energy storage apparatus and the conductive layer is configured as the second electrode of the energy storage apparatus. The first electrode and second electrode are electrically connected to the controller circuitry and configured to provide energy to the controller circuitry when main power of the storage device is removed.

According to further embodiments, a method of implementing an internal energy storage apparatus into an electronic device having a metallic housing comprises applying a first carbon layer to an inner service of the metallic housing, applying a dielectric spacer upon the first carbon layer, and then applying a conductive layer having a second carbon layer over the dielectric spacer. The metallic housing and the conductive layer are electrically connected to a circuitry of the electronic device, wherein the energy storage apparatus is configured to provide energy to the circuitry when main power of the electronic device is removed.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

The following detailed description is directed to technologies for implementing a space-efficient internal energy storage apparatus in a data storage device, such as a hard-disk drive ("HDD") or solid-state drive ("SSD"), having a metallic or otherwise electrically-conductive housing or case structure. Data storage devices are sensitive to rapid power supply removal. For example, an HDD or SSD device may receive a write command and store the data to be written in a volatile memory buffer before transferring the data to the recording media. If power is removed from the device before the write operation is completed, the end user data buffered within the volatile electrical components (e.g., DRAM) may be subject to permanent loss. Therefore, providing internal energy storage capability becomes critical for completing critical operations in order to mitigate end user data loss and/or maintain data integrity. However, providing internal energy storage requires additional space within the apparatus forcing larger packaging. For example, conventional electrolytic capacitors, supercapacitors or rechargeable batteries may require a significant amount of printed circuit board ("PCB") space.

According to embodiments described herein, an internal energy storage apparatus may be implemented in a data storage or other electronic device without requiring significant PCB or other internal space. The described internal energy storage apparatus relies on significant energy storage advancements pertaining to capacitor and battery charge capacity and charge rate, predominantly residing in increased plate surface area and dielectric thickness, and further utilizes conductive elements of the case structure as an integral part of the energy storage apparatus to produce significant energy storage and dispersion within the existing confines of the device. Utilizing the technologies described herein, an energy storage apparatus may be constructed with approximately 10 $\mu F/cm^2$ of electrical charge storage utilizing an electrode made of readily available materials shaped to fit within a metallic housing of the data storage or other electronic device This provides the energy storage needed to prevent end user data loss while allowing for more compact packaging by integrating the energy storage apparatus into the case.

Figure 1:
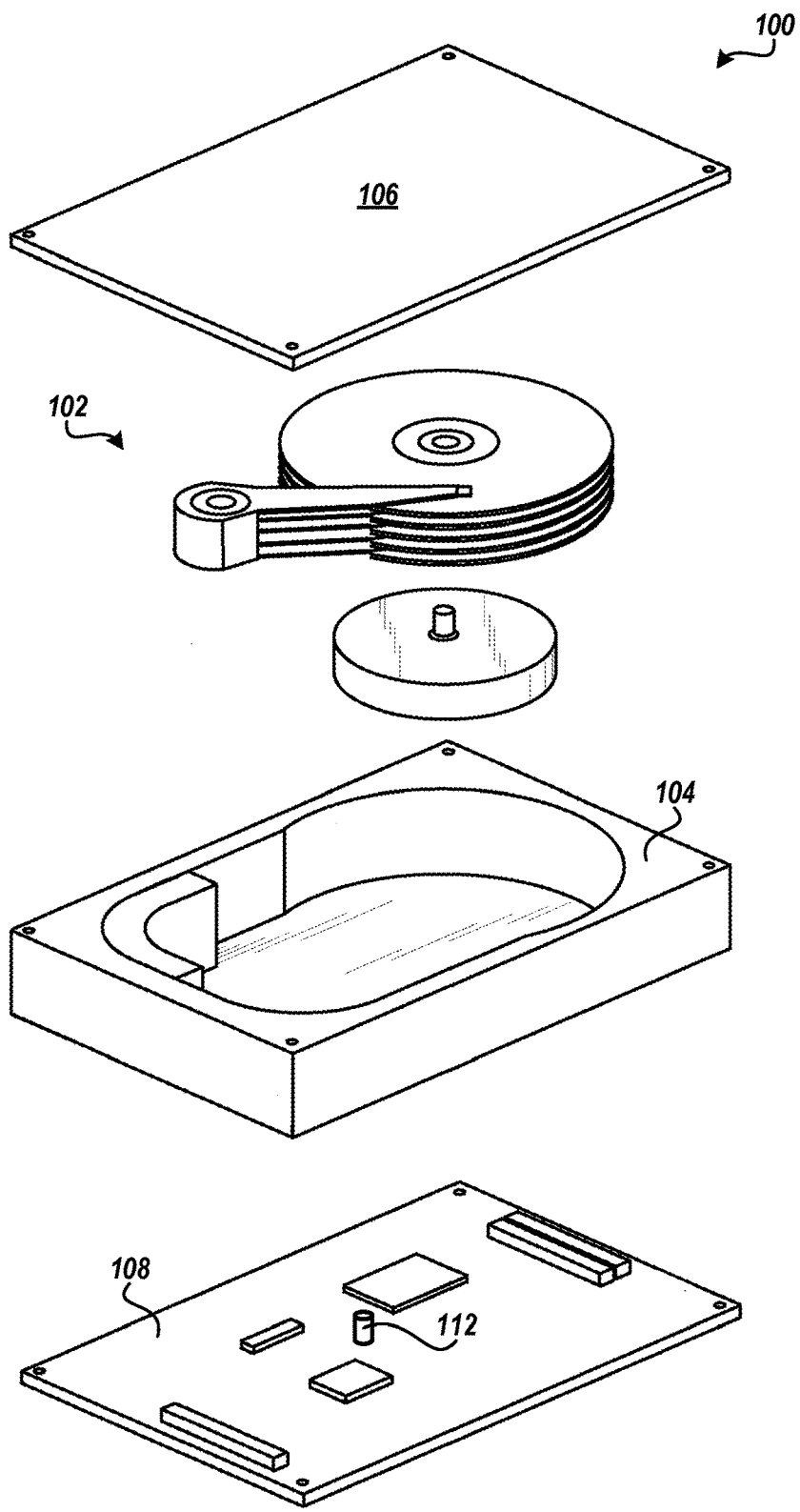
FIG. 1 is a diagram of an illustrative storage device, including a metallic case structure, according to embodiments described herein.

FIG. 1 illustrates an electronic device having a metallic or otherwise electrically-conductive housing or case structure in which a space-efficient internal energy storage apparatus may be implemented, according to some embodiments. Specifically, FIG. 1 shows structural and operational components of a conventional storage device 100, such as an HDD or SSD device. The storage device 100 may include drive components 102, such as disks, heads, actuators, preamp circuits, solid-state memory circuits and the like, housed inside a case structure. The case structure may comprise a metallic housing 104 in which the drive components 102 are disposed. According to embodiments, the metallic housing 104 may be constructed of an electrically conductive material, such as aluminum or steel. The case structure may further comprise a cover 106, for enclosing the drive components 102 within the metallic housing 104.

According to embodiments, the storage device 100 further includes a PCB 108 containing controller circuitry, volatile memory components, component driver circuitry, and the like. The PCB 108 may further contain an electrical power connector for the supply of external electrical energy to the device for normal operation. The PCB 108 may be attached to and/or located within the metallic housing 104. According to further embodiments, the PCB 108 may further include an electrically-conductive connector 112, such as an aluminum or copper post, that electrically couples the circuit board traces to metallic housing 104 as well as providing structural support for the PCB.

Figure 2:
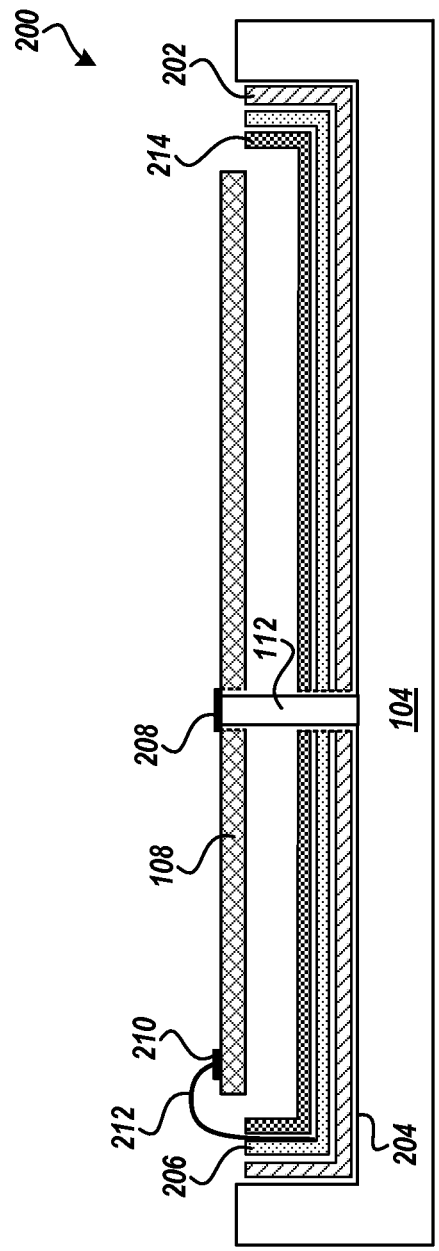
FIG. 2 is a block diagram showing one example of an internal energy storage apparatus integrated with the conductive case structure of a storage device, according to embodiments described herein.

FIG. 2 shows one example of an internal energy storage apparatus 200 integrated with the conductive case structure of a storage device 100, according to some embodiments. The energy storage apparatus 200 comprises a dielectric spacer or separator 202 applied to an interior surface 204 of the metallic housing 104. In some embodiments, the separator 202 may comprise a very thin insulator made of paper, carbon, plastic, ceramic, air or any combination of these and other insulating materials. The separator 202 may be malleable such that it may follow the contours of the interior surface 204 of the metallic housing 104. In further embodiments, the interior surface 204 may be soaked in an electrolyte before the separator 202 is applied.

The energy storage apparatus 200 further includes a conductive layer 206 applied over the separator 202. The conductive layer 206 may be made of any material that allows the conductive layer to act as an electrode in a parallel-plate capacitor or supercapacitor comprising the metallic housing 104, the dielectric spacer or separator 202 and the conductive layer 206. According to some embodiments, the conductive layer 206 is made of an electrically-conductive material with a high specific surface area. For example, the conductive layer 206 may be made of a conductive sheeting coated with activated carbon pressed into the desired shape to allow it to follow the contours of the interior surface 204 of the metallic housing 104. A 1000 $m^2$/gram activated carbon conductive layer 206 yields the approximately 10 $\mu F/cm^2$ of electrical charge storage desired for the energy storage apparatus 200. In other embodiments, the conductive layer 206 may comprise conductive graphene sheeting, carbon aerogels, carbon nanotubes, carbide-derived carbon ("CDC"), or the like. In further embodiments, the conductive layer 206 may include conducting polymers, metal oxides, and other materials to increase the conductivity of the carbon-based materials.

The metallic housing 104 is electrically connected to circuits on the PCB 108 such that it acts as one electrode for the energy storage apparatus 200. For example, the metallic housing 104 may be electrically connected to a first contact point 208 on the PCB 108 via the electrically-conductive connector 112 to a structurally connecting the PCB to the metallic housing. In some embodiments, the metallic housing 104 may act as the cathode for the parallel-plate capacitor or supercapacitor comprising the energy storage apparatus 200. Similarly, the conductive layer 206 is also electrically connected to a second contact point 210 on the PCB 108 such that it acts as a second electrode for the energy storage apparatus 200. For example, the conductive layer 206 may be electrically connected to the second contact point 210 via a conductive lead 212. In some embodiments, the conductive layer 206 may act as the anode for the parallel-plate capacitor or supercapacitor comprising the energy storage apparatus 200.

In further embodiments, the energy storage apparatus 200 also includes an insulation layer 214 over the conductive layer 206 to prevent electrical shorts and/or prevent discharge of the energy storage apparatus. While the storage device 100 is under normal operation with external power applied to the electrical power connector 110, the circuitry on the PCB 108 may supply energy to the energy storage apparatus 200 through the electrical connections so that it remains charged. If power is removed from the storage device 100 during operation, the energy storage apparatus 200 may discharge to provide energy back to the PCB circuitry so that any pending operations may complete. Because parallel-plate capacitors and supercapacitors tend to have low working voltage relative to traditional capacitors, the PCB 108 may further include a charge-pump circuit to derive usable voltage for the remainder of the circuitry, according to further embodiments.

Figure 3:
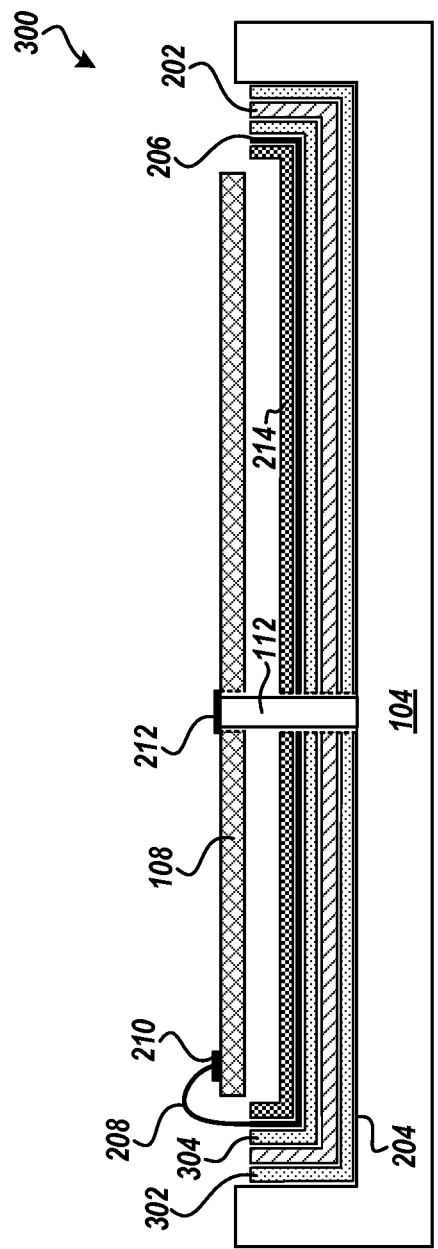
FIG. 3 is a block diagram showing another example of an internal energy storage apparatus integrated with the conductive case structure of a storage device, according to embodiments described herein.

FIG. 3 shows another example of an internal energy storage apparatus 300 integrated with the conductive case structure of the storage device 100, according to further embodiments. In these embodiments, the interior surface 204 of the metallic housing 104 is coated with a first carbon-based layer 302 having a high specific surface area ("SSA"). For example, the first carbon-based layer 302 may comprise graphene, activated carbon, carbon aerogels, carbon nanotubes, CDC, or the like. In some embodiments, the first carbon-based layer 302 may include conducting polymers, metal oxides, and other materials to increase the conductivity of the carbon-based materials.

The dielectric spacer or separator 202 of the energy storage apparatus 300 is interposed between the first carbon-based layer 302 and a second carbon-based layer 304. The second carbon-based layer 304 may be made of the same or a similar material as the first carbon-based layer 302. The conductive layer 206 is in contact with the second carbon-based layer 304. In some embodiments, an insulation layer 214 may be applied over the conductive layer 206, as described above. In this configuration, the energy storage apparatus comprises a double-layer capacitor or supercapacitor comprising the metallic housing 104 and the first carbon-based layer as one electrode (e.g., cathode) and the conductive layer 206 and the second carbon-based layer 304 as the second electrode (e.g., anode).

It will be appreciated that the energy storage apparatuses 200, 300 shown in FIGS. 2 and 3 and described above are merely example embodiments. Other configurations for energy storage apparatuses 200, 300 may be conceived upon reading of this disclosure that implement capacitors or supercapacitors with any number of layers and materials that may be shaped to fit within the metallic housing of a data storage device 100 or other electronic device and that utilize the conductive elements of the case structure of the device as an electrode. It is intended that this application include all such configurations.

Figure 4:
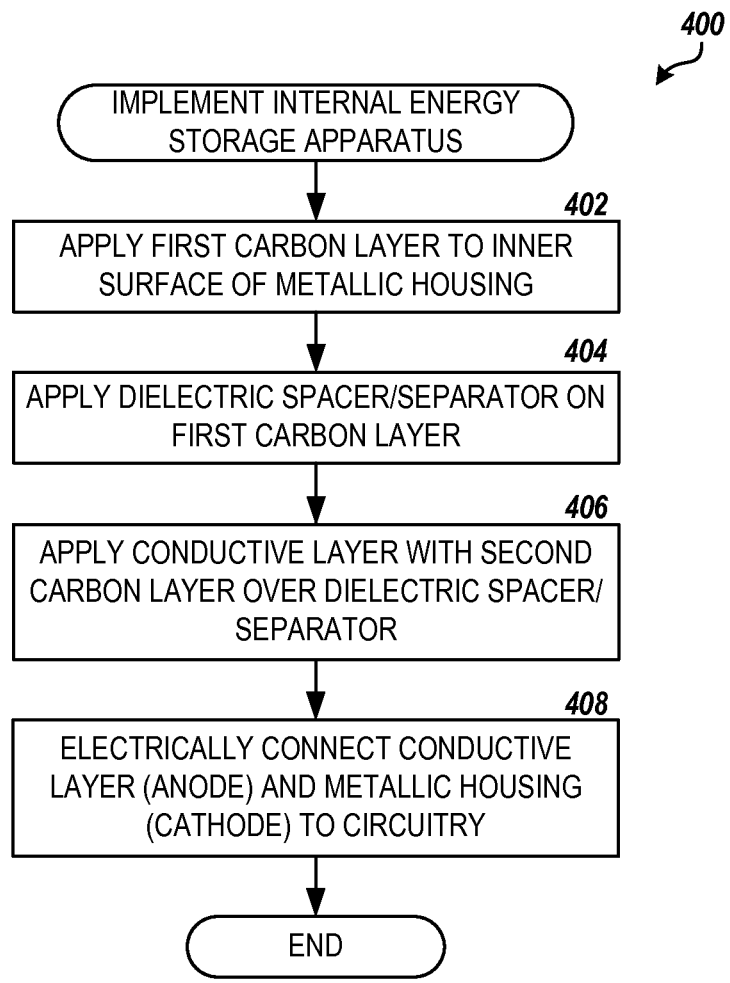
FIG. 4 is a flow diagram showing one method for implementing an internal energy storage apparatus into a storage device having metallic or otherwise electrically-conductive housing, according to embodiments described herein.

FIG. 4 illustrates one method 400 for implementing an internal energy storage apparatus, such as the energy storage apparatus 300 depicted in FIG. 3 and described above, into an electronic device having a metallic or otherwise electrically-conductive housing, according to some embodiments. In some embodiments, the method 400 may be performed during the construction of a storage device 100, such as an HDD or SSD, by the manufacturer of the device. The energy storage apparatus 300 may provide the energy storage needed to prevent end user data loss when main power is removed for the storage device 100 while allowing for more compact packaging by integrating the energy storage apparatus into the housing.

The method includes step 402, where a first carbon layer 302 is applied to an interior surface of the metallic housing 104 of the device 100. The first carbon layer 302 may comprise a carbon-based material having a high SSA, such as graphene, activated carbon, carbon aerogels, carbon nanotubes, CDC, or the like. The first carbon-based layer 302 may be applied to the interior surface of the metallic housing 104 in liquid or powder form utilizing a sprayer or other applicator, or in sheet form by pressing the sheeting into the contours of the interior surface 204. From step 402, the method proceeds to step 404, where a dielectric spacer or separator 202 is applied on top of and in contact with the first carbon layer 302. The separator 202 may comprise a very thin insulator made of paper, carbon, plastic, ceramic, air or any combination of these and other insulating materials. The separator 202 may be applied by pressing the insulator into the contours of the interior surface 204 of the metallic housing 104.

The method 400 proceeds from step 404 to step 406, where a conductive layer 206 including a second carbon layer 304 is applied over the over the separator 202. The second carbon layer 304 may comprise the same or a similar carbon-based material as the first carbon layer 302. For example, the conductive layer 206 and second carbon layer 304 may comprise conductive graphene sheeting, a metallic sheeting coated with activated carbon, carbon aerogels, carbon nanotubes, carbide-derived carbon ("CDC"), or the like. The conductive layer 206 and second carbon layer 304 may be malleable such that they may take the shape of the interior surface 204 of the metallic housing 104 when pressed into place.

From step 406, the method proceeds to step 408, where the metallic housing 104 representing the first electrode (e.g., cathode) of the energy storage apparatus 300 and the conductive layer 206 representing the second electrode (e.g., anode) of the energy storage apparatus is electrically connected to the circuitry on the PCB 108 of the storage device 100. In this manner the energy storage apparatus 300 may be charged by the circuitry during normal operation of the storage device 100 and provide energy to the device when power is removed in order for the storage device to complete operations and preserve end-user data stored in volatile memory components, as further described above. From step 408, the routine 400 ends. It will be appreciated that the method 400 described herein may vary based upon the configuration of the energy storage apparatus being implemented in the storage device 100. As such, alternate implementations are included in which steps, operations, or functions may not be included or performed at all or may be performed out of order from that shown or discussed, including substantially concurrently or in reverse order, depending on the functionality involved, as would be understood by those reasonably skilled in the art of the present disclosure.

Based on the foregoing, it will be appreciated that technologies for implementing a space-efficient internal energy storage apparatus in a data storage device are presented herein. While embodiments are described herein in regard to a storage device, it will also be appreciated that the embodiments described in this disclosure may be utilized by any electronic device requiring backup energy storage in order to preserve volatile data when main power is removed, such as computing devices, communication devices, network appliances, consumer electronic devices, and the like. The above-described embodiments are merely possible examples of implementations, merely set forth for a clear understanding of the principles of the present disclosure.

It will be further appreciated that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more particular embodiments.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

What is claimed is:

1. An energy storage apparatus for integration into an electronic device, the energy storage apparatus comprising:
   a metallic housing of the electronic device, the metallic housing having an exterior surface and interior surface and a plurality of components of the electronic device disposed within;
   a conductive layer disposed parallel to the interior surface of the metallic housing; and
   a separator disposed between the interior surface and the conductive layer, wherein the metallic housing is configured to act as a first electrode of the energy storage apparatus and the conductive layer is configured to act as an opposing electrode to the first electrode, the conductive layer and the metallic housing being electrically connected to circuitry of the electronic device and configured to provide energy to the circuitry when main power of the electronic device is removed.

2. The energy storage apparatus of claim 1, wherein the metallic housing, the separator, and the conductive layer comprise a parallel-plate capacitor.

3. The energy storage apparatus of claim 2, wherein the metallic housing represents a cathode and the conductive layer represents an anode of the parallel-plate capacitor.

4. The energy storage apparatus of claim 1, wherein the conductive layer comprises a carbon-based material with a high specific surface area.

5. The energy storage apparatus of claim 1, wherein the conductive layer comprises conductive graphene sheeting.

6. The energy storage apparatus of claim 1, wherein the conductive layer comprises a conductive material coated with activated carbon.

7. The energy storage apparatus of claim 1, wherein the separator comprises a thin layer of insulating material.

8. The energy storage apparatus of claim 1, further comprising a carbon layer interposed between the metallic housing and the separator.

9. The energy storage apparatus of claim 1, wherein the electronic device comprises a data storage device.

10. The energy storage apparatus of claim 1, wherein the circuitry is contained on a printed circuit board coupled to the metallic housing by an electrically-conductive connector, the electrically-conductive connector configured to structurally support the printed circuit board within the metallic housing and electrically connect the circuitry contained thereon to the first electrode of the energy storage apparatus.

11. A storage device comprising:

a plurality of drive components disposed within a metallic housing, the metallic housing comprising an interior surface and an exterior surface;

a printed circuit board containing controller circuitry; and an internal energy storage apparatus comprising the interior surface of the metallic housing, a conductive layer disposed parallel to the interior surface, and a separator disposed between the interior surface and the conductive layer, wherein the metallic housing comprises a first electrode of the energy storage apparatus and the conductive layer comprises a second electrode of the energy storage apparatus, and wherein the first electrode and second electrode are electrically connected to the controller circuitry and configured to provide energy to the controller circuitry when main power of the storage device is removed.

12. The storage device of claim 11, wherein the conductive layer comprises a carbon-based material with a high specific surface area.

13. The storage device of claim 12, wherein the conductive layer comprises conductive graphene sheeting.

14. The storage device of claim 11, wherein a carbon layer is interposed between the metallic housing and the separator.

15. The storage device of claim 14, wherein the carbon layer comprises activated carbon.

16. The storage device of claim 14, wherein the separator comprises a dielectric spacer.

17. The storage device of claim 11, further comprising an electrically-conductive connector coupling the metallic housing to the printed circuit board and configured to structurally support the printed circuit board within the metallic housing and electrically connect the controller circuitry contained thereon to the first electrode of the internal energy storage apparatus.

* * * * *